United States Patent
Kimura

(10) Patent No.: US 7,254,080 B2
(45) Date of Patent: Aug. 7, 2007

(54) FUSE CIRCUIT AND ELECTRONIC CIRCUIT

(75) Inventor: Hiroyuki Kimura, Miyagi (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/355,682

(22) Filed: Feb. 16, 2006

(65) Prior Publication Data

US 2006/0285414 A1    Dec. 21, 2006

(30) Foreign Application Priority Data

Jun. 20, 2005    (JP) .............................. 2005-179636

(51) Int. Cl.
*G11C 17/18* (2006.01)
(52) U.S. Cl. .............................. 365/225.7; 365/230.06; 365/189.05
(58) Field of Classification Search ............. 365/225.7, 365/230.06, 189.05, 189.01, 226

See application file for complete search history.

(56) References Cited

U.S. PATENT DOCUMENTS

| | | | |
|---|---|---|---|
| 5,731,733 A * | 3/1998 | Denham | 327/525 |
| 5,774,404 A * | 6/1998 | Eto | 365/222 |
| 6,548,884 B2 * | 4/2003 | Oikawa | 257/529 |

FOREIGN PATENT DOCUMENTS

| | | |
|---|---|---|
| JP | 2000-68458 A | 3/2000 |
| JP | 2000-200497 A | 7/2000 |

* cited by examiner

*Primary Examiner*—Gene N. Auduong
(74) *Attorney, Agent, or Firm*—Charles Bergere

(57) ABSTRACT

A fuse circuit and an electronic circuit for outputting a signal in accordance with the breakage of fuses even when the resistances of the broken fuses differ, reducing leak currents, and lowering power consumption. The fuse circuit includes a plurality of fuse lines, each including a fuse connected to a low-potential ground line and to a high-potential line via a MOS transistor and a constant current source. The fuse lines also each includes an inverter having an input terminal connected between the MOS transistor and constant current source. A reference circuit is connected in parallel to the fuse lines and includes a current source, a transistor, and a resistor connected in series. The transistor of the reference circuit has an input terminal connected to its control terminal and to the control terminal of each MOS transistor.

6 Claims, 5 Drawing Sheets

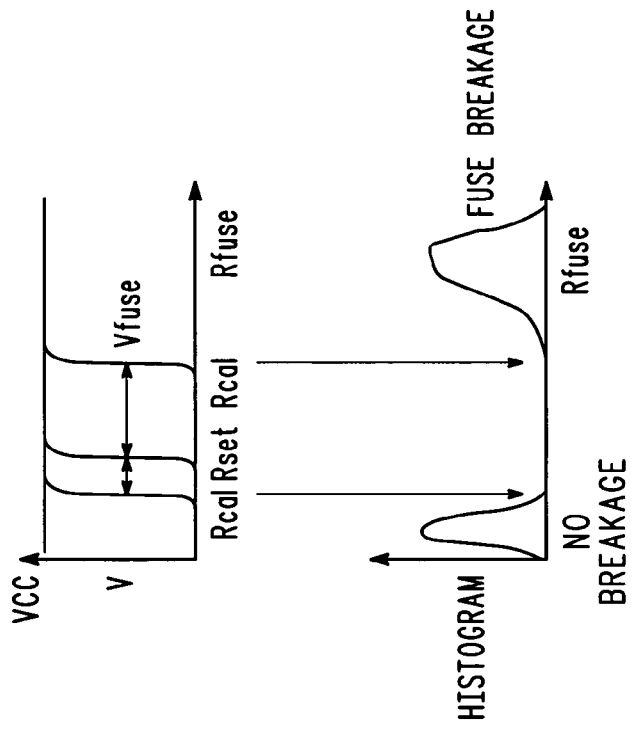
FIG. 4B
FIG. 4C
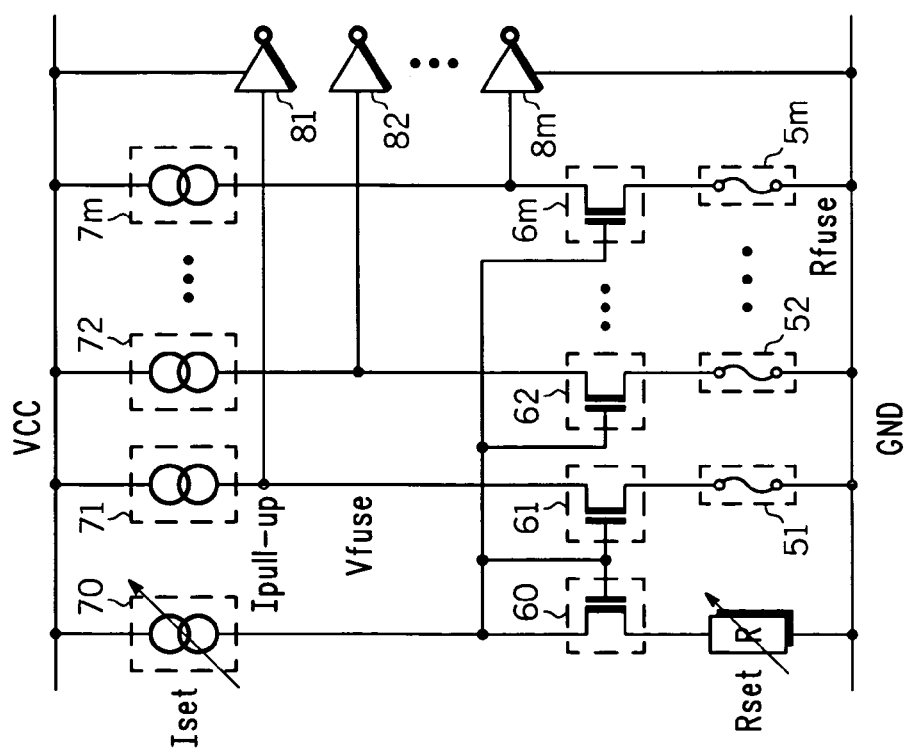
FIG. 4A

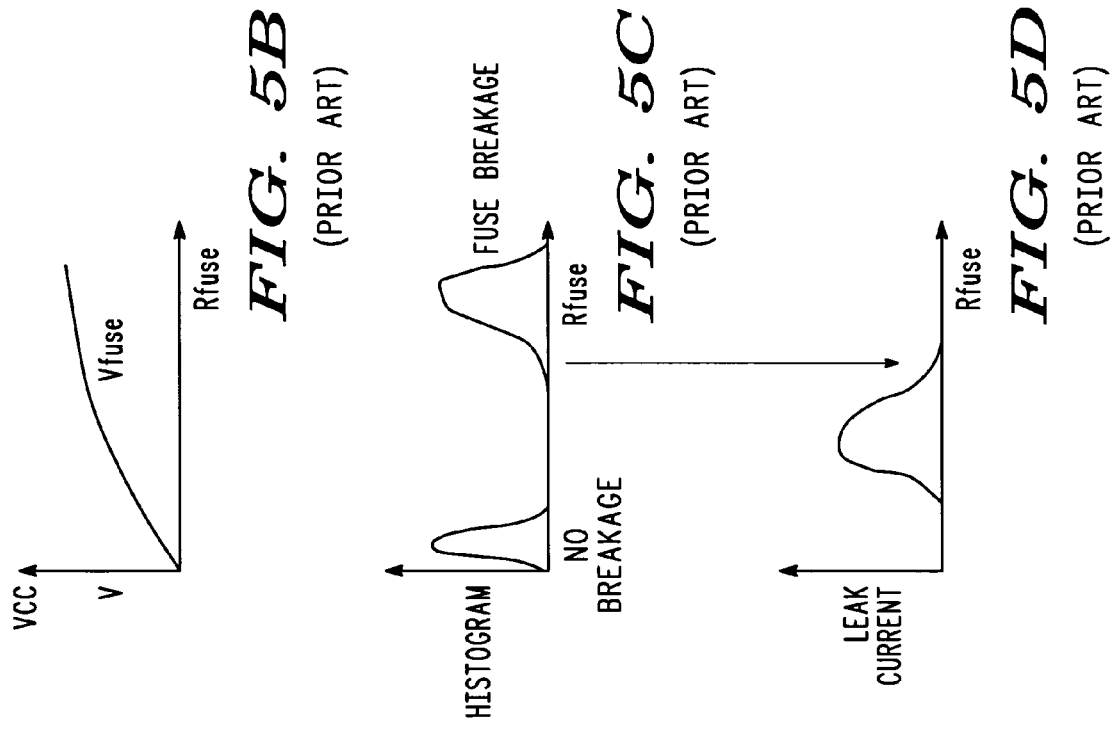
FIG. 5B (PRIOR ART)
FIG. 5C (PRIOR ART)
FIG. 5D (PRIOR ART)
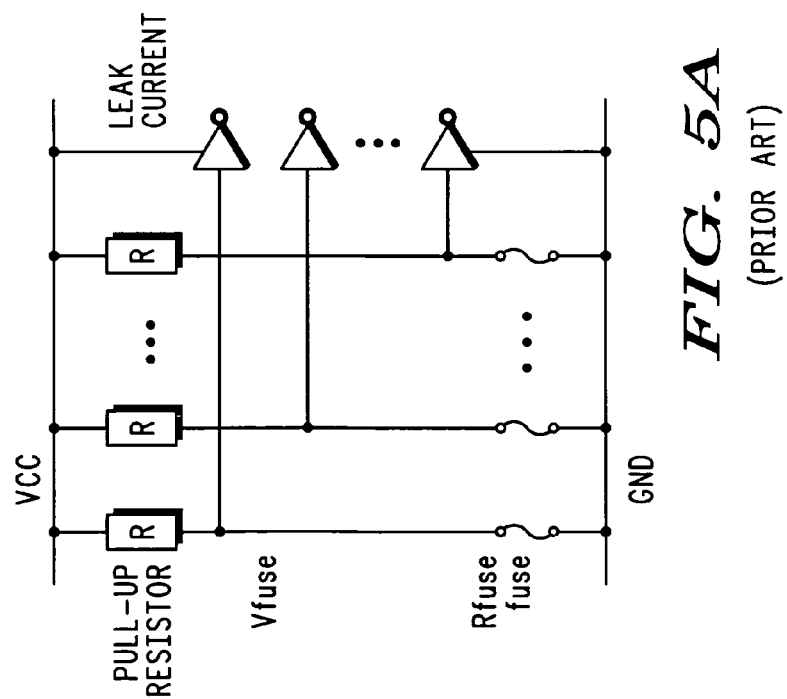
FIG. 5A (PRIOR ART)

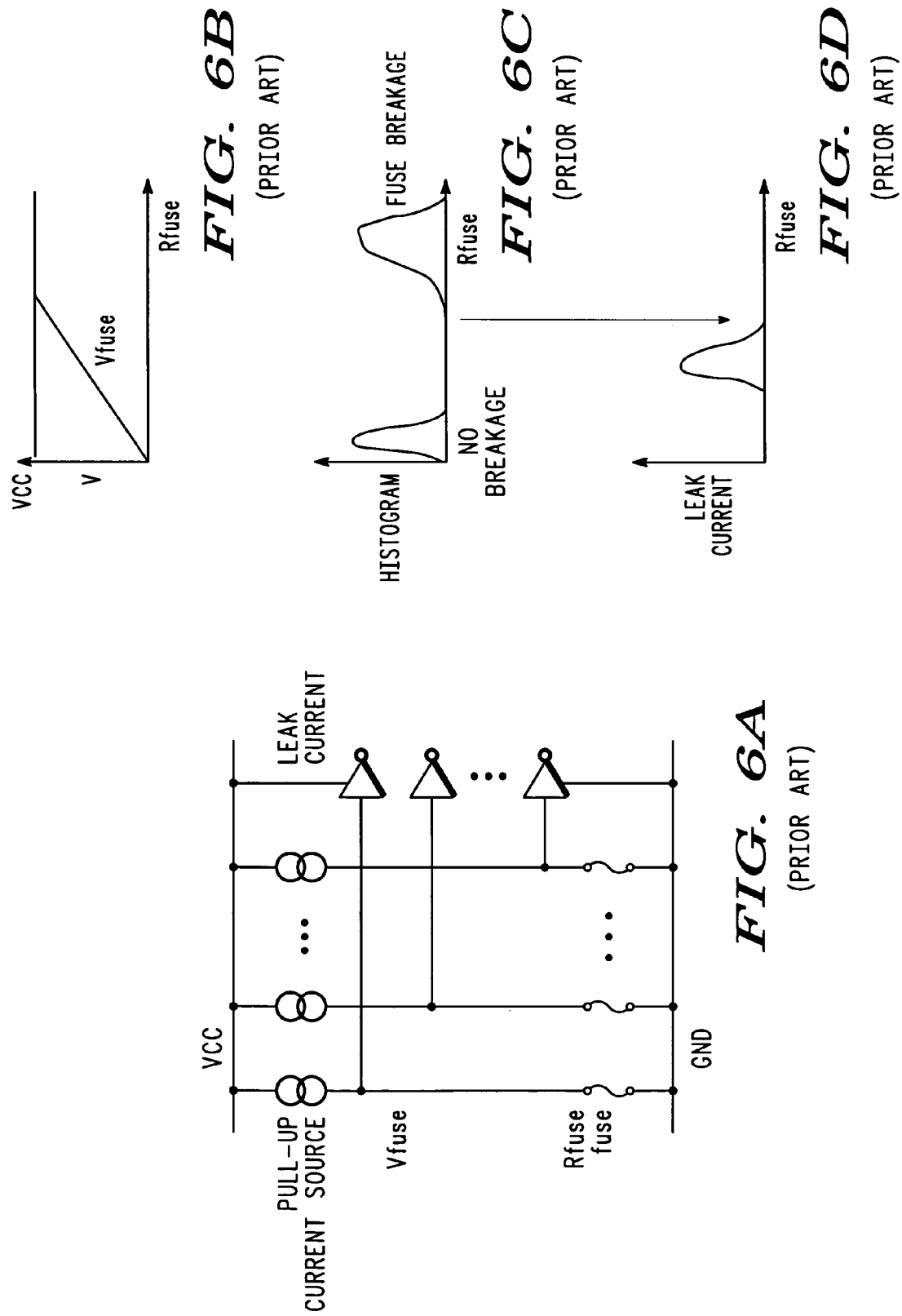

FUSE CIRCUIT AND ELECTRONIC CIRCUIT

BACKGROUND OF THE INVENTION

The present invention relates to a fuse circuit for use in a trimming circuit that adjusts the electrical characteristics of, for example, a semiconductor device, and to an electronic circuit including the fuse circuit.

A semiconductor integrated circuit may include a fuse circuit for setting various operations, such as trimming and other desired operations. For example, a trimming circuit, which is arranged in an electronic circuit such as a semiconductor device, may include such a fuse circuit. To adjust the characteristics of the electronic circuit, the trimming circuit changes its resistance by switching transistors included in the trimming circuit. The fuse circuit enables the trimming circuit to perform the switching operation of the transistors. More specifically, the fuse circuit controls the switching operation of a plurality of stages of transistors included in the trimming circuit by breaking fuses corresponding to the transistors.

Japanese Laid-Open Patent Publication No. 2000-68458 describes a technique for displaying an unchangeable and unique identification number by breaking fuses. A circuit configured in accordance with this prior art technique is, for example, a fuse circuit shown in FIG. 5A. The fuse circuit shown in FIG. 5A includes a plurality of fuse lines, each including a fuse. The fuse lines are connected in parallel between a line for high-potential VCC and a line for ground GND, which functions as low potential. The fuse circuit further includes a plurality of inverters, each of which has an input terminal connected between the fuse of one fuse line and the high-potential VCC and an output terminal connected to the gate terminal of a transistor.

When the fuse of each fuse line is completely broken, the resistance of the fuse is infinite. However, when the fuse of each fuse line is incompletely broken, the resistance of the fuse is finite. For example, each fuse line may include a pull-up resistor as shown in FIG. 5A. In this case, the voltage Vfuse of each fuse line is a divided value obtained by the fuse resistance Rfuse and the pull-up resistance. Thus, the voltage Vfuse of each fuse line changes according to the ratio of the fuse resistance Rfuse and the pull-up resistance. When the fuse is incompletely broken, the fuse resistance Rfuse is finite so that the ratio of the fuse resistance Rfuse and the pull-up resistance becomes finite. This generates an intermediate voltage between the high-potential VCC and the ground GND as the voltage Vfuse of the fuse line.

FIG. 5B is a histogram of the fuse resistance Rfuse. When the fuse is not broken, the resistance of the fuse is ideally zero. However, the resistance of the fuse is actually not zero and is a small value. The fuse resistance may show values distributed as shown in the left portion of FIG. 5B. When the fuse is broken, the resistance of the fuse is ideally infinite. However, there may be cases in which the fuse is incompletely broken. Thus, the fuse resistance may show values distributed as shown in the right portion of FIG. 5B. If the complementary operation of the inverters is imperfect in this circuit, leak current may be generated in the inverters. In particular, the complementary operation of the inverters becomes imperfect and leak currents are generated in the inverters in a wide range as shown in FIG. 5D when the voltage Vfuse changes slowly in accordance with the fuse resistance.

Japanese Laid-Open Patent Publication No. 2000-200497 describes a technique relating to a fuse determination circuit of which critical resistance dependency and temperature dependency are small. The critical resistance is a boundary value used to determine whether a fuse is broken. FIG. 6A shows a circuit described in the publication that is configured in correspondence with the present invention. The fuse circuit shown in FIG. 6A has the same configuration as the fuse circuit of FIG. 5A except in that each pull-up resistor is replaced by a pull-up current source. In the circuit shown in FIG. 6A, the pull-up current source is a constant current source. Accordingly, the voltage Vfuse of each fuse line is a value proportional to the resistance of the entire fuse line.

This circuit configuration permits the voltage Vfuse to increase linearly in proportion to the resistance of each fuse line. When the product of the pull-up current and the fuse resistance Rfuse is greater than the voltage of the high-potential VCC, the voltage Vfuse of the fuse line becomes equal to the voltage of the high-potential VCC. Thus, with respect to the voltage Vfuse corresponding to the fuse resistance Rfuse, the range in which leak current is generated in the inverters is narrow as shown in FIG. 6C.

It is preferable that the resistance of each pull-up resistor be high to reduce consumption current in each fuse line of the fuse circuit shown in FIG. 5A. However, when the resistance of the pull-up resistor is high, the resistance of each broken fuse and the resistance of the corresponding pull-up resistor are close to each other. Thus, the voltage Vfuse changes more slowly, and a large leak current may be generated in an inverter depending on differences in the fuse resistances. As a result, consumption current of the inverter cannot be reduced.

The circuit shown in FIG. 6A has a narrower range in which the complementary operation of the inverters is imperfect compared to the circuit shown in FIG. 5A. However, the voltage range is still large, and leak currents may be generated in the inverters. The range in which leak currents are generated in the inverters may further be narrowed by increasing the pull-up current. However, this may increase consumption current of each fuse line. Further, the pull-up current must be accurate. Accordingly, it is difficult to reduce consumption current in each fuse line while reducing leak currents generated in the inverters.

SUMMARY OF THE INVENTION

It is an object of the present invention to provide a fuse circuit and an electronic circuit that ensures the output of signals in accordance with the broken state of fuses regardless of differences in the resistances of the broken fuses while also reducing leak current to further reduce consumption power.

One object of the present invention is a fuse circuit including a plurality of fuse lines, each including a constant current source, a control transistor, and a fuse connected in series between a high-potential line and a low-potential line. The fuse circuit outputs a signal for each fuse line in accordance with potential at a connection node between the constant current source and the control transistor of each fuse line. The fuse circuit includes a reference circuit for providing the control transistor of each fuse line with a reference bias.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4A is a circuit diagram showing a fuse circuit;

FIG. 4B is a graph showing the relationship between voltage and resistance;

FIG. 4C is a histogram of resistance;

FIG. 5A is a circuit diagram showing a first prior art example of a fuse circuit;

FIG. 5B is a graph showing the relationship between voltage and resistance;

FIG. 5C is a histogram showing resistance;

FIG. 5D is a graph showing the relationship between leak current and resistance;

FIG. 6A is a circuit diagram showing a second prior art example of a fuse circuit;

FIG. 6B is a graph showing the relationship between voltage and resistance;

FIG. 6C is a histogram showing resistance; and

FIG. 6D is a graph showing the relationship between leak current and resistance.

DETAILED DESCRIPTION OF THE PREFERRED EMBODIMENTS

First Embodiment

Figure 1:
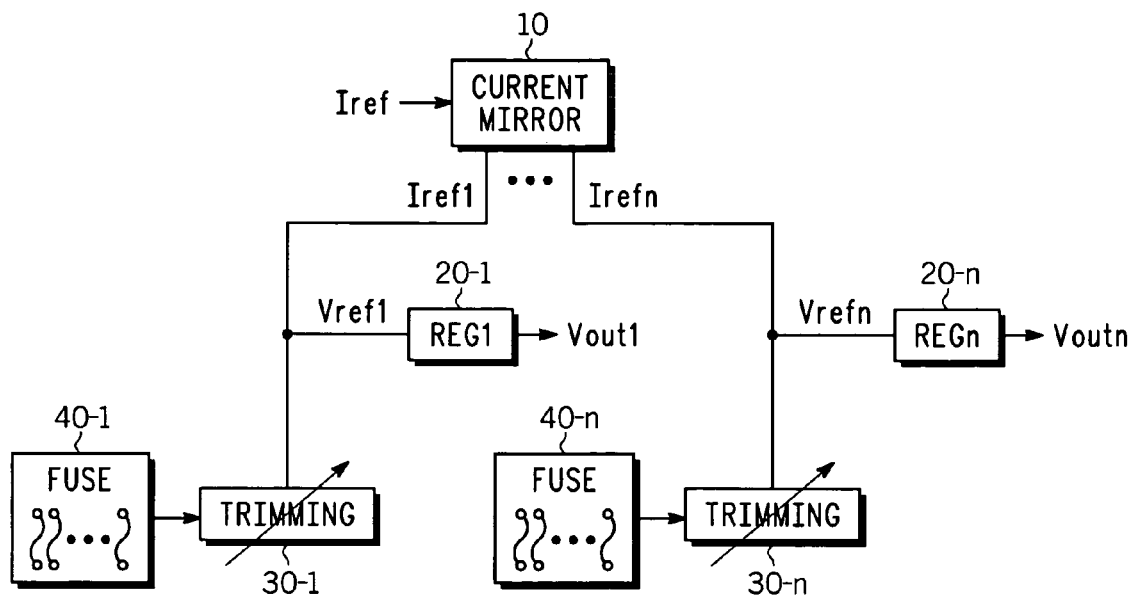
FIG. 1 is a circuit diagram showing an electronic circuit according to a preferred embodiment of the present invention.

A first embodiment of the present invention will now be described with reference to FIGS. 1 to 3. In the first embodiment, a fuse circuit of the present invention is applied to a reference voltage supply circuit, which serves as an electronic circuit shown in FIG. 1.

The reference voltage supply circuit to which the fuse circuit of the present invention is applied will now be described with reference to FIG. 1. The reference voltage supply circuit includes a current mirror circuit 10. The current mirror circuit 10 is supplied with a reference current Iref. The current mirror circuit 10 is connected to regulators 20-1 to 20-n. The current mirror circuit 10 provides the regulators 20-1 to 20-n with output currents Iref1 to Irefn based on the reference current Iref. The lines connecting the current mirror circuit 10 to the regulators 20-1 to 20-n are respectively connected to trimming circuits 30-1 to 30-n.

The resistances of the trimming circuits 30-1 to 30-n are finely adjusted to adjust reference voltages Vref1 to Vrefn supplied to the regulators 20-1 to 20-n, respectively. Based on the reference voltages Vref1 to Vrefn, the regulators 20-1 to 20-n supply their operating circuits (not shown) with voltages Vout1 to Voutn, which are adjusted as required.

Figure 2:
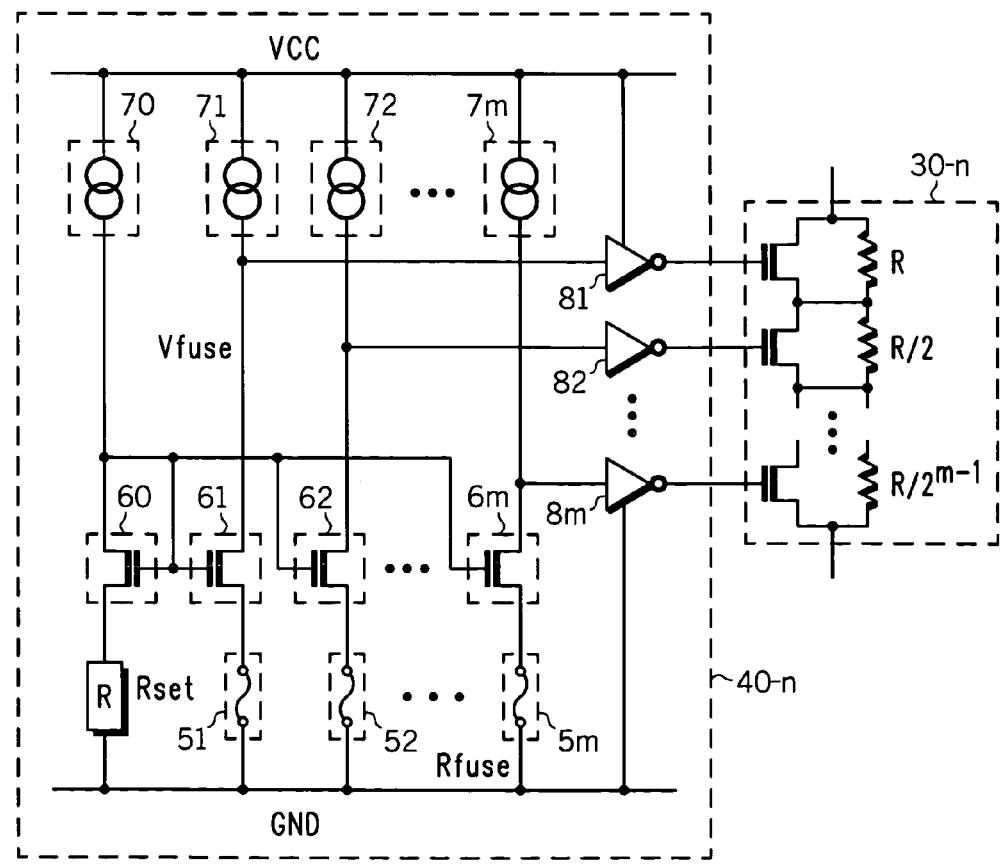
FIG. 2 is a circuit diagram showing a fuse circuit according to a first embodiment of the present invention.

Each of the trimming circuits 30-1 to 30-n is configured, for example, by connecting a plurality of resistor units in series as shown in FIG. 2. Each resistor unit includes a metal oxide semiconductor (MOS) transistor, which functions as a switching device, and a resistor, which are connected in parallel to each other. The resistance of the resistor unit of which MOS transistor is activated is zero. The resistance of the trimming circuit 30-n changes to a value obtained by adding the resistances of the resistor units of which MOS transistors are inactivated. The trimming circuits 30-1 to 30-n are respectively provided with fuse circuits 40-1 to 40-n.

The fuse circuits 40-1 to 40-n of the present invention will now be described with reference to FIG. 2. Each fuse circuit is configured by connecting in parallel a plurality of fuse lines between a high-potential VCC line and a low-potential ground GND. The fuse lines respectively include fuses 51 and 52 to 5m.

In the fuse lines, MOS transistors 61, 62, ..., 6m are arranged at the high-potential VCC side of the fuses 51, 52, ... 5m, respectively. The MOS transistors 61 to 6m are N-channel MOS transistors. More specifically, the source terminals of the MOS transistors 61 to 6m are connected to the ground GND line via the corresponding fuses 51 to 5m. The drain terminals of the MOS transistors 61 to 6m are connected to the high-potential VCC line via constant current sources 71, 72, ..., 7m, respectively. The constant current sources 71 to 7m are pull-up current sources for enabling the flow of constant current through the corresponding fuse lines using the voltage of the high-potential VCC line. Further, the drain terminals of the MOS transistors 61, 62, ..., 6m are connected to the input terminals of inverters 81, 82, ..., 8m, respectively.

In the first embodiment, each of the inverters 81 to 8m functions as a logical circuit. The inverters 81 to 8m are connected to the gate terminals of the MOS transistors in the trimming circuit 30-n. The inverters 81 to 8m are complementary circuits, which comprise P-channel MOS transistors and N-channel MOS transistors. Thus, the inverters 81 to 8m do not generate leak currents when their input signals are shifting and generate output signals set at a high (H) level or at a low (L) level. The output signals of the inverters 81 to 8m control the switching operation of the MOS transistors in the trimming circuit 30-n.

Each of the fuse circuits 40-1 to 40-n of the present invention includes a reference line functioning as a reference circuit, which is connected in parallel to the fuse lines in the fuse circuit. A resistor R, which functions as a reference resistor, is arranged in the reference line. The reference resistance of the resistor R is defined as resistance Rset. The resistance Rset is an intermediate value between the resistances before and after each of the fuses 51 to 5m is broken. The resistance of each of the fuses 51 to 5m that is broken is, for example, several megohms (M$\Omega$) or greater even if the fuse is incompletely broken. The resistance of each of the fuses 51 to 5m that is not broken is several tens of ohms to several hundreds ohms or less. Accordingly, the ratio of the fuse resistance before and after the fuse is broken is easily set to about 10,000. In the first embodiment, a value that is ten times to hundred times the fuse resistance before or after the fuse is broken is used as the reference resistance.

An N-channel MOS transistor 60, which functions as a switching device, is connected in series to the high-potential VCC side of the resistor R. The MOS transistor 60 has a gate terminal, which functions as a control terminal, connected to its drain terminal, which functions as a device input terminal, and to the gate terminal of each of the MOS transistors 61 to 6m. The gate terminals of the MOS transistors 61 to 6m function as control terminals. A current source 70, which functions as a reference current source, is further arranged on the reference line. The current source 70 supplies the reference line with the same current as that supplied by the constant current source connected to each fuse line.

The operation of the fuse circuit 40-n shown in FIG. 2 will now be described.

The current flowing through each fuse line is a current of which value is inversely proportional to the resistance of the fuse with respect to the resistance Rset of the reference line. More specifically, the current flowing through each fuse line is a current that causes the voltage at the high-potential VCC side terminal of each of the fuses 51 to 5m to be equal to the voltage at the high-potential VCC side terminal of the resistor R in the reference line.

Figure 3A:
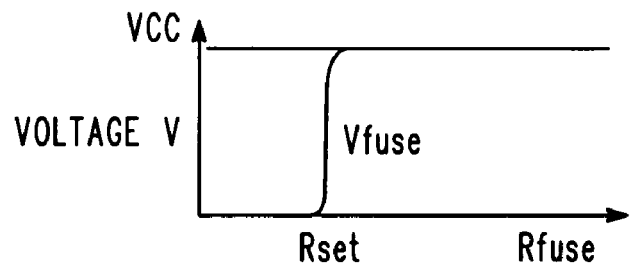
FIG. 3A is a graph showing the relationship between voltage and resistance.
Figure 3B:
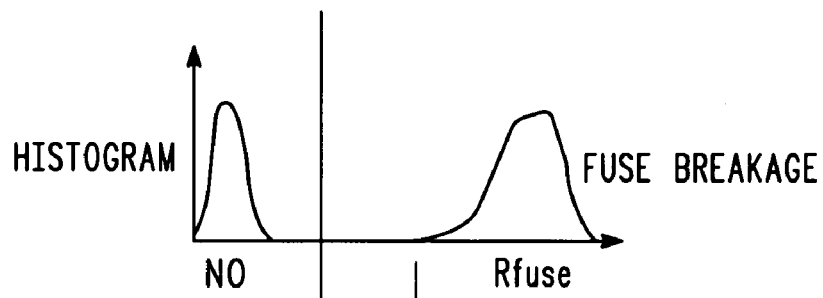
FIG. 3B is a histogram of resistance.

Referring FIG. 3A, it becomes difficult for current to flow through each of the MOS transistors 61 to 6m when the fuse resistance Rfuse is greater than the resistance Rset. More specifically, current that is inversely proportional to the fuse resistance Rfuse flows through each of the MOS transistors 61 to 6m. This increases the output voltage of each of the constant current sources 71 to 7m so that the voltage Vfuse at the node connected to the input terminal of each of the inverters 81 to 8m becomes equal to the voltage of the high-potential VCC line. As a result, an H level signal having the voltage of the high-potential VCC line is input to each of the inverters 81 to 8m so that each of the inverters 81 to 8m outputs an L level signal.

Current easily flows through each of the MOS transistors 61 to 6m when the fuse resistance Rfuse is smaller than the resistance Rset. This decreases the output voltage of each of the constant current sources 71 to 7m so that the voltage Vfuse at the node connected to the input terminal of each of the inverters 81 to 8m becomes equal to the voltage (0 V) of the ground GND line. As a result, an L level signal having 0 V is input to each of the inverters 81 to 8m so that each of the inverters 81 to 8m outputs a H level signal. The fuse resistance Rfuse of a fuse that is not broken is much smaller than the resistance Rset as shown in FIG. 3. Thus, the voltage of the fuse line including the unbroken fuse is 0 V.

Figure 3C:
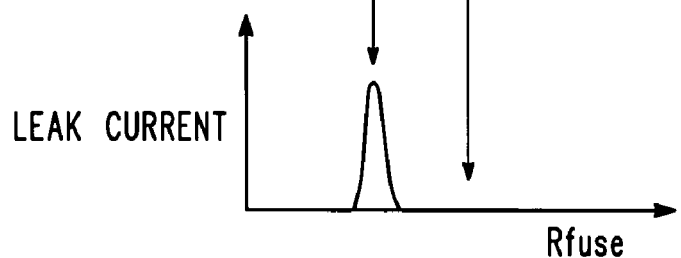
FIG. 3C is a graph showing the relationship between leak current and resistance.

The voltage Vfuse of the fuse line changes in an extremely narrow range about the resistance Rset as shown in FIG. 3A. The output of the fuse circuit 40-n is inverted immediately when the voltage Vfuse of the fuse line exceeds this range. As shown in FIG. 3C, leak currents are generated in the inverters 81 to 8m in a range in which the voltage Vfuse changes. However, the range in which leak currents are above, the voltage of each fuse line is 0 V when each of the fuses 51 to 5m is unbroken. Further, even if the fuse is incompletely broken, no current flows through the fuse line. This reduces power consumption of the inverters 81 to 8m, of which input terminals are connected to the fuse lines.

The first embodiment has the advantages described below.

In the first embodiment, the fuse lines including the fuses 51 to 5m have one of their ends connected to the ground GND line and the other one of their ends connected to the high-potential VCC line via the MOS transistors 61 to 6m and the constant current sources 71 to 7m. Further, the input terminals of the inverters 81 to 8m are connected to connection nodes between the MOS transistors 61 to 6m and the constant current sources 71 to 7m, respectively. Additionally, the reference line, in which the resistor R having the resistance Rset and the MOS transistor 60 are connected in series, is connected in parallel to the fuse lines. The MOS transistor 60 has its gate terminal connected to its drain terminal and to the gate terminals of each of the MOS transistors 61 to 6m. This supplies the MOS transistors 61 to 6m with a reference bias from the reference circuit. Thus, when the resistance of each fuse is smaller than the resistance Rset of the resistor R, each of the MOS transistors 61 to 6m is enabled to output a large current. In this case, current supplied from each of the constant current sources 71 to 7m flows to the ground GND line. This causes the voltage Vfuse at the connection node of each fuse line to become equal to the potential (0 V) at the ground GND line. When each fuse is broken and the resistance of each fuse is greater than the resistance Rset of the resistor R, each of the MOS transistors 61 to 6m is enabled to output only a small current. Thus, current supplied from each of the constant current sources 71 to 7m fails to flow through each of the MOS transistors 61 to 6m. In this case, the potential at the connection node of each fuse line becomes equal to the potential at the high-potential VCC line. In this way, the reference bias provided to the gate terminal of each of the MOS transistors 61 to 6m causes the potential at the connection node of each fuse line to change in accordance with the fuse resistance. This narrows the range in which the potential at the connection node becomes an intermediate value between the high potential and the low potential. As a result, leak currents generated in the inverters 81 to 8m, which are connected to the connection nodes of the fuse lines, are reduced.

Further, the voltage of the input terminal of each of the inverters 81 to 8m is determined by the relationship between the reference resistance and the fuse resistance. Thus, the current value of each of the constant current sources 71 to 7m and the current value of the current source 70 included in the reference circuit do not need to be accurate. More specifically, as long as the ratio of the current source 70 and each of the constant current sources 71 to 7m can be maintained in a predetermined range, the voltage at the connection node of each fuse line is unaffected. Thus, the fuse circuit is enabled to output an appropriate signal even when the resistances of the fuses differ or when the current values of the constant current sources are small. As a result, consumption power of the fuse circuit is reduced.

The reference circuit and the fuse lines are each formed with a current source (70 and 71 to 7m), a transistor (60 and 61 to 6m), and a resistor (the fuse serves as a resistor in the fuse line). In this way, the reference circuit and the fuse lines are formed by similar circuits. This enables the fuse circuit of the present invention to be realized with a small number of devices.

In the first embodiment, the inverters 81 to 8m in the fuse circuit 40-n are connected to MOS transistors for performing the switching operation of the trimming circuit. Thus, even when the fuses 51 to 5m are broken incompletely, the MOS transistors of the trimming circuits 30-1 to 30-n output signals in accordance with the breakage of the fuses 51 to 5m and ensures the desired resistances. This ensures that the reference voltage supply circuit, which uses these trimming circuits, performs the desired operation of supplying reference voltage.

Second Embodiment

A second embodiment of the present invention will now be described. To avoid redundancy, like or same reference numerals are given to those components that are the same as the corresponding components of the first embodiment. Such components will not be described in detail.

In the second embodiment, a variable resistor is used as the resistor R of the reference line as shown in FIG. 4A to enable the resistance Rset of the resistor R to be varied. Further, a variable current source is used as the current source 70 of the reference line to enable the current Iset to be varied.

The current supplied to each of the constant current sources 71, 72, ..., 7m in the fuse lines has a value represented by Ipull-up. The current provided from the current source 70 on the reference line is has a value represented by current Iset. In this case, the voltage Vfuse of the fuse line with respect to the fuse resistance Rfuse changes, and the output voltage characteristic of the voltage Vfuse moves in parallel to the resistance Rcal as shown in FIG. 4B. The resistance Rcal is expressed by the next equation.

$$Rcal = Rset \times Iset / Ipull\text{-}up.$$

In the second embodiment, the resistance Rset or the current Iset is variable. The resistance Rcal is changed by changing the output voltage characteristic of the voltage Vfuse of the fuse line. This enables determination of critical resistances at which the output of the fuse circuit 40-n is inverted. In detail, the resistance Rcal is decreased to determine a lower limit critical resistance at which the output of each of the inverters 81 to 8m is inverted by the fuses that are not broken. The resistance Rcal is increased to determine an upper limit critical resistance at which the output of each of the inverters 81 to 8m is inverted by the incompletely broken fuses. When the critical resistances are determined for the fuses that are not broken and the fuses that are incompletely broken in the fuse circuit, at least either one of the resistance Rset and the current Iset is adjusted so that there is a sufficient margin from the upper and lower limits of the critical resistance.

The second embodiment has the advantages described below.

In the second embodiment, the variable resistor is used as the resistor R of the reference line to enable the resistance Rset to be varied. Further, the variable current source is used as the current source 70 of the reference line to enable the current Iset to be varied. The critical resistances that invert the output of the fuse circuit 40-n are determined by changing at least one of the resistance Rset and the current Iset to change the output voltage characteristic. Further, at least one of the resistance Rset and the current Iset is adjusted to an intermediate value between the determined upper and lower limit critical resistances. This ensures sufficient margins from the upper and lower limits and further ensures that the switching operations of the inverters 81 to 8m are performed.

It should be apparent to those skilled in the art that the present invention may be embodied in many other specific forms without departing from the spirit or scope of the invention. Particularly, it should be understood that the present invention may be embodied in the following forms.

In the above embodiments, the N-channel MOS transistors 60 and 61 to 6m are used in each of the fuse circuits 40-1 to 40-n. However, the present invention is not limited to such configuration. For example, other types of transistors, such as P-channel MOS transistors and bipolar transistors, may be used. When P-channel MOS transistors are used, the VCC line is set to have a potential lower than the ground potential.

In the above embodiments, the fuse circuits 40-1 to 40-n are connected to the trimming circuits 30-1 to 30-n via the inverters 81 to 8m. However, the present invention should not be limited to such a structure. The fuse circuits 40-1 to 40-n may be formed with logical circuits other than inverters, such as NAND circuits. In this case, each fuse circuit reduces leak currents generated in its logical circuits and reduces consumption power.

In the above embodiments, the inverters 81 to 8m are respectively arranged in the fuse circuits 40-1 to 40-n, and each of the fuse circuits 40-1 to 40-n outputs a signal via its inverters 81 to 8m. However, the present invention is not limited to such a configuration. For example, the inverters 81 to 8m. may be excluded from the fuse circuits 40-1 to 40-n.

In the above embodiments, the fuse circuits 40-1 to 40-n are connected to the trimming circuits 30-1 to 30-n that are applied to the reference voltage generation circuit incorporated in, for example, a semiconductor device. However, the present invention is not to such a configuration. The fuse circuit of the present invention may be applied to another electronic circuit to finely adjust the electrical characteristic of the electronic circuit.

The present examples and embodiments are to be considered as illustrative and not restrictive, and the invention is not to be limited to the details given herein, but may be modified within the scope and equivalence of the appended claims.

What is claimed is:

1. A fuse circuit, comprising:
   a plurality of fuse lines, each including a constant current source, a control transistor, and a fuse connected in series between a high-potential line and a low-potential line, wherein the fuse circuit outputs a signal for each fuse line in accordance with the potential at a connection node between the constant current source and the control transistor of each fuse line;
   a reference circuit connected to the plurality of fuse lines for providing the control transistor of each fuse line with a reference bias; and
   a plurality of logical circuits, wherein the logical circuits are respectively connected to the connection nodes between the constant current source and the control transistor of each fuse line, and wherein outputs of the logical circuits are connected to a trimming circuit.

2. The fuse circuit according to claim 1, wherein:
   the reference circuit is configured by connecting a reference current source, a reference transistor, and a reference resistor in series between the high-potential line and the low-potential line; and
   the reference circuit provides the control transistor of each fuse line with a bias of the reference transistor as the reference bias by commonly using a control terminal of the reference transistor and a control terminal of the control transistor of each fuse line.

3. The fuse circuit according to claim 2, wherein the reference circuit has a device input terminal connected to the control terminal of the reference transistor.

4. The fuse circuit according to claim 2, wherein the control transistor of each fuse line and the reference transistor comprise at least one of N-channel and P-channel metal oxide semiconductor transistors.

5. The fuse circuit according to claim 1, wherein the reference bias provided by the reference circuit is variable.

6. The fuse circuit according to claim 1, wherein the logical circuit is an inverter, the inverter generating an output signal that is provided to a transistor for performing a switching operation of a trimming circuit.

* * * * *